(12) United States Patent
Zongxiang et al.

(10) Patent No.: US 9,200,172 B2
(45) Date of Patent: Dec. 1, 2015

(54) PHTHALOCYANINE/ POLYMER NANOCOMPOSITE INK FOR OPTOELECTRONICS

(75) Inventors: Xu Zongxiang, Fujian (CN); A. L. Roy Vellaisamy, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 194 days.

(21) Appl. No.: 13/879,795

(22) PCT Filed: Nov. 5, 2010

(86) PCT No.: PCT/CN2010/001777
§ 371 (c)(1),
(2), (4) Date: Apr. 16, 2013

(87) PCT Pub. No.: WO2012/058788
PCT Pub. Date: May 10, 2012

(65) Prior Publication Data
US 2013/0217811 A1    Aug. 22, 2013

(51) Int. Cl.
*C08K 5/34* (2006.01)
*C09B 47/04* (2006.01)
(Continued)

(52) U.S. Cl.
CPC ............ *C09D 11/52* (2013.01); *B82Y 10/00* (2013.01); *B82Y 30/00* (2013.01); *C09B 47/0673* (2013.01);
(Continued)

(58) Field of Classification Search
CPC ...... B82Y 10/00; B82Y 30/00; C09B 67/009; C09B 67/0005; C09B 47/0673; H01L 51/0078; H01L 51/0036; H01L 51/4253; H01L 51/0047; C09D 11/52; Y02E 10/549

USPC ....... 524/88; 540/140; 438/82; 977/773, 774; 257/E31.003
See application file for complete search history.

(56) References Cited

U.S. PATENT DOCUMENTS

2005/0247340 A1    11/2005  Zeira
2009/0227785 A1     9/2009  Mayo et al.
2009/0266418 A1*   10/2009  Hu et al. ................ 136/260

FOREIGN PATENT DOCUMENTS

JP    H04280681 A    10/1992
JP    H08290665 A     5/1996
(Continued)

OTHER PUBLICATIONS
International Search Report for PCT Patent Application No. CN2010/001777 dated Aug. 11, 2011, 4 pages.

*Primary Examiner* — William Cheung
(74) *Attorney, Agent, or Firm* — Amin, Turocy & Watson, LLP

(57) ABSTRACT

Aspects describe phthalocyanine (Pc) molecules with peripheral modifications of its core (e.g., alkyl substituents) so that the Pc can self assemble, for example under vacuum sublimation, and form nanocrystals of a size on the order of nanometers. The Pc nanocrystals can be prepared, for example, by a simple vapor deposition method. Further aspects describe a polymer composite ink based Pc nanocrystals in a polymer matrix, which can be formed, for example, under a solution process approach. For example, the polymer matrix can be a different p-type conjugated polymer from the Pc nanocrystals, which are inherently p-type semiconductors. This can increase the film formation ability and charge transport properties of the polymer composite ink. The polymer composite ink can be utilized, for example, in the fabrication of optoelectronic devices, such as photovoltaic devices and/or thin film transistors. The optoelectronic devices can exhibit high power conversion efficiency (PCE), for example 6-7 percent.

14 Claims, 8 Drawing Sheets

(51) Int. Cl.
| | |
|---|---|
| *H01L 21/00* | (2006.01) |
| *C09D 11/52* | (2014.01) |
| *B82Y 10/00* | (2011.01) |
| *C09B 67/46* | (2006.01) |
| *C09B 67/08* | (2006.01) |
| *C09B 47/067* | (2006.01) |
| *B82Y 30/00* | (2011.01) |
| *H01L 51/00* | (2006.01) |
| *H01L 51/42* | (2006.01) |

(52) U.S. Cl.
CPC ........... *C09B 67/0005* (2013.01); *C09B 67/009* (2013.01); *H01L 51/0078* (2013.01); *H01L 51/0036* (2013.01); *H01L 51/0047* (2013.01); *H01L 51/4253* (2013.01); *Y02E 10/549* (2013.01)

(56) References Cited

FOREIGN PATENT DOCUMENTS

| | | |
|---|---|---|
| JP | 2005072410 A | 3/2005 |
| WO | 2008133151 A1 | 11/2008 |
| WO | 2010122921 A1 | 10/2010 |

\* cited by examiner

PHTHALOCYANINE/ POLYMER NANOCOMPOSITE INK FOR OPTOELECTONICS

CROSS-REFERENCE TO RELATED APPLICATION

The subject application is a US national stage application of PCT Application Serial No. PCT/CN2010/001777, filed Nov. 5, 2010, and entitled "PHTHALOCYANINE/POLYMER NANOCOMPOSITE INK FOR OPTOELECTONICS," the disclosure of which is incorporated herein by reference in its entirety.

TECHNICAL FIELD

The subject disclosure generally relates to a polymer composite ink and, more particularly, to a polymer composite ink based on phthalocyanine (Pc) nanocrystal dyes, of a size on the order of nanometers, in polymer matrices that can be utilized in the fabrication of optoelectronic devices.

BACKGROUND

Due to the growing demand for renewable energy sources ("green energy"), the manufacture of photovoltaic devices has steadily increased. Photovoltaic devices convert light energy to electricity. Through the photovoltaic effect, photovoltaic devices can absorb light (e.g., infrared, visible, ultraviolet), and photons of light can knock electrons to a higher energy state and generate electricity. One type of photovoltaic device is a solar panel. For example, solar panels can be used as power generators for buildings as well as consumable electronic devices, such as mobile phones, mp3 players, notebook computers, etc.

Many commercially available photovoltaic devices for consumable electronic devices are expensive, for example, due to high production costs. One type of photovoltaic device is a wafer-based silicon cell. Wafer-based cells tend to be expensive, due at least in part to expensive production costs, yet these cells exhibit a relatively low (e.g., approximately 11-13 percent) efficiency. Another type of photovoltaic device is a hybrid semiconducting device, such as power plastic devices (e.g., a photovoltaic device on a plastic substrate) formed through printing of polymers. This hybrid device is less expensive to produce, but exhibits a lower efficiency (e.g., approximately 3.5 percent). The highest efficiency that has been reported for printable solar cells is only 5 percent. In this regard, manufacturing and use of conventional photovoltaic devices suffer from at least the above-identified drawbacks of inefficiency and high production costs.

The above-described deficiencies of today's photovoltaic devices, systems and methods are merely intended to provide an overview of some of the problems of conventional devices, systems and methods, and are not intended to be exhaustive. Other problems with the state of the art and corresponding benefits of some of the various non-limiting embodiments may become further apparent upon review of the following detailed description.

SUMMARY

The following presents a simplified summary of the various embodiments in order to provide a basic understanding of some aspects described herein. This summary is not an extensive overview of the disclosed subject matter. It is intended to neither identify key or critical elements of the disclosed subject matter nor delineate the scope of the subject embodiments. Its sole purpose is to present some concepts of the disclosed subject matter in a simplified form as a prelude to the more detailed description that is presented later.

Various embodiments are directed to a polymer composite ink based on phthalocyanine (Pc) nanocrystal dyes, of a size on the order of nanometers, in polymer matrices that can be utilized in the fabrication of optoelectronic devices.

In one embodiment, method comprises synthesizing phthalocyanine (Pc) from a mixture of 4-alkylphthalonitrile and metal (II) salt, growing Pc nanocrystals, wherein the Pc nanocrystals have a size on the order of nanometers and combining the Pc nanocrystals with conjugated polymer(s) into a thin film. The method can also include fabricating a photovoltaic device and/or a thin-film transistor by coating a patterned silicon/silicon dioxide substrate with the Pc nanocrystals and the conjugated polymer(s).

The synthesizing can include heating the mixture of 4-alkylphthalonitrile and metal (II) salt in quinoline, e.g., under a nitrogen atmosphere, cleaning a precipitate, e.g., by an ethanol solution and by a sodium hydroxide solution, from the mixture and drying the precipitate, e.g., in an oven. The cleaning can also include cleaning the precipitate, of a blue color, until a cleaning solution is clear.

The growing of the Pc nanocrystals can include heating the Pc in a heating zone of a horizontal quartz tube furnace and collecting the Pc nanocrystals in a cool zone of the horizontal quartz tube furnace, wherein the Pc nanocrystals self-assemble from the Pc.

The combining can include mixing the Pc nanocrystals with the conjugated polymer(s) and dispersing the Pc nanocrystals and the conjugated polymer(s) or combining the Pc nanocrystals with poly(3-hexylthiophene)(P3HT) and/or P3HT/phenyl-C61-butyric acid methyl ester (PCBM).

In another non-limiting embodiment, an apparatus or article of manufacture includes a thin film of conjugated polymer(s) doped with phthalocyanine (Pc) nanocrystals, wherein the Pc nanocrystals are of a size on the order of nanometers and wherein the conjugated polymer(s) is a different p-type semiconductor than the Pc nanocrystals. The Pc nanocrystals can comprise a core with alkyl substituents. The apparatus can be a photovoltaic cell and the conjugated polymer(s) can include poly(3-hexylthiophene)(P3HT) and/or phenyl-C61-butyric acid methyl ester (PCBM). The apparatus can also be a thin film transistor where the conjugated polymer(s) is poly(3-hexylthiophene)(P3HT). In one aspect, the apparatus has a power conversion efficiency (PCE) of greater than 5 percent, e.g., at least 6 percent or at least 7 percent. In one embodiment, the apparatus achieves a mobility of at least 0.025 $cm^2/Vs$ and in another embodiment, the apparatus achieves a mobility of at least 0.1 $cm^2/Vs$.

In another embodiment, Pc nanocrystals are provided comprising a core with alkyl substituents, wherein the Pc nanocrystals are of a size on the order of nanometers.

In another embodiment, a nanocomposite ink is provided, comprising the Pc nanocrystals mixed with a conjugated polymer. In one embodiment, the conjugated polymer can be P3HT. In another embodiment, the conjugated polymer can be P3HT/PCBM. The Pc nanocrystals are provided comprising a core with alkyl substituents, wherein the Pc nanocrystals are of a size on the order of nanometers.

The following description and the annexed drawings set forth in detail certain illustrative aspects of the disclosed subject matter. These aspects are indicative, however, of but a few of the various ways in which the principles of the various embodiments may be employed. The disclosed subject matter is intended to include all such aspects and their equivalents. Other advantages and distinctive features of the disclosed subject matter will become apparent from the following detailed description of the various embodiments when considered in conjunction with the drawings.

DETAILED DESCRIPTION

Overview

Figure 1:
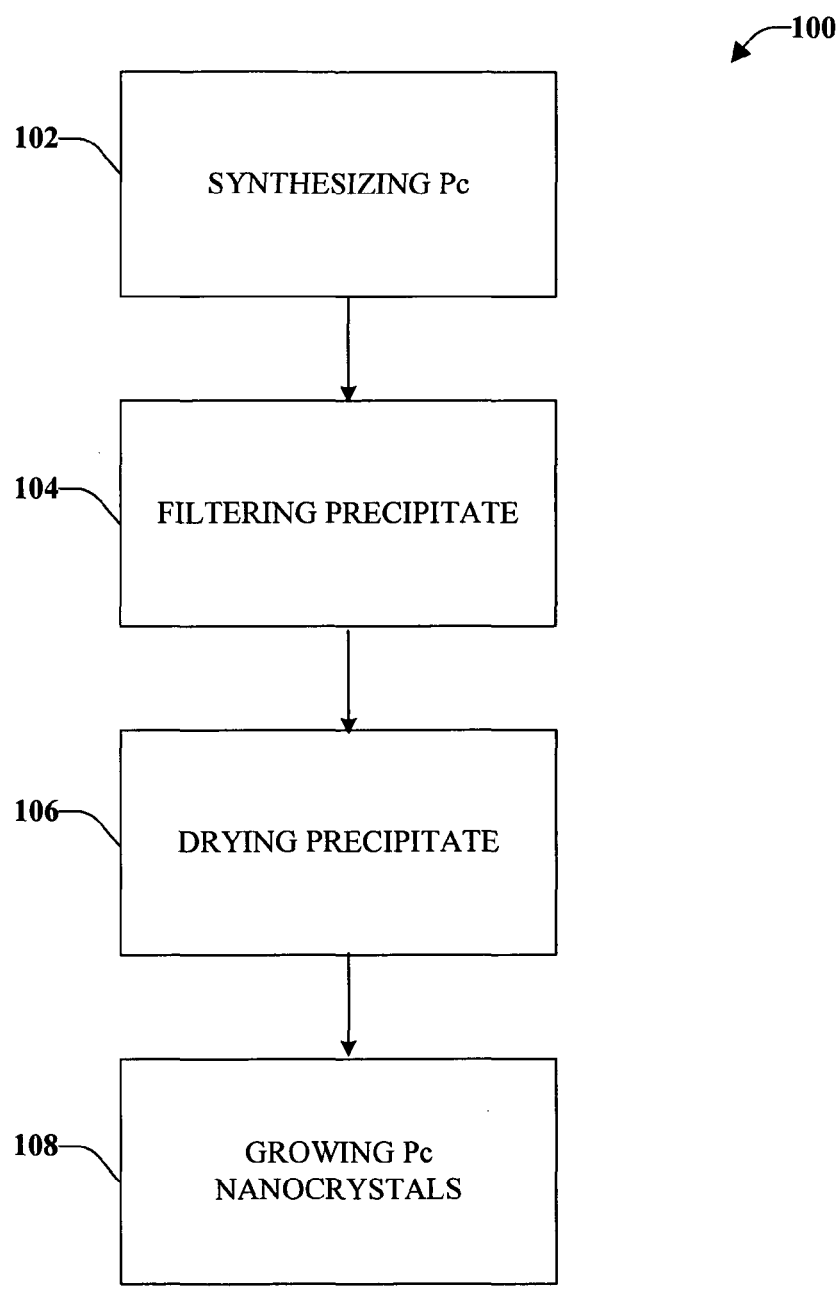
FIG. 1 is a schematic process flow diagram of a process for fabricating Pc nanocrystals to be utilized within Pc/polymer composites.

According to an aspect, described is a method for fabricating a polymer composite ink based on phthalocyanine (Pc) nanocrystal dyes in polymer matrices that can be utilized in the fabrication of optoelectronic devices. The method can comprise synthesizing Pc from a mixture of 4-alkylphthalonitrile and metal (II) salt. For example, the synthesizing can include heating the mixture in quinoline (e.g., in a nitrogen atmosphere), cleaning a blue-colored precipitate from the mixture (e.g., rinsing with an ethanol solution and a sodium hydroxide solution until the cleaning solution is clear), and drying the precipitate (e.g., in an oven). The method can further comprise growing Pc nanocrystals of a size on the order of nanometers. The growing can include heating the Pc in a heating zone of a horizontal quartz tube furnace and collecting the Pc nanocrystals in a cool zone of the horizontal quartz tube furnace; the Pc nanocrystals can self-assemble from the Pc. The method can further comprise combining the Pc nanocrystals with at least one conjugated polymer into a thin film. The combining can include mixing the Pc nanocrystals with the at least one conjugated polymer and dispersing the Pc nanocrystals and the at least one conjugated polymer. For example, the conjugated polymer can be at least one of poly(3-hexylthiophene) (P3HT) or P3HT/phenyl-C61-butyric acid methyl ester (PCBM). The method can further comprise fabricating at least one of a photovoltaic device or a thin-film transistor by coating a patterned silicon/silicon dioxide substrate with the Pc nanocrystals and the at least one conjugated polymer.

According to another aspect, described is an apparatus (e.g., a photovoltaic cell or a thin film transistor). The apparatus can comprise a thin film of at least one conjugated polymer doped with Pc nanocrystals. The Pc nanocrystals can be of a size on the order of nanometers, for example, due to a core that includes alkyl substituents. The at least one conjugated polymer can be a different p-type semiconductor than the Pc nanocrystals. For example, if the apparatus is a photovoltaic cell, the conjugated polymer can be P3HT/PCBM. If the apparatus is a thin film transistor, the conjugated polymer can be P3HT. The apparatus can exhibit a power conversion efficiency of 5-6 percent or more and a mobility of 0.025-0.1 $cm^2/Vs$ or more.

According to another aspect, described are Pc nanocrystals. The Pc nanocrystals can comprise a core with alkyl substituents. The alkyl substituents can allow Pc to self-assemble into the Pc nanocrystals with a size on the order of nanometers. While conventional Pc (e.g., without the alkyl substituents) can self-assemble to form a wire shape with a size on the order of micrometers, the Pc nanocrystals can form nanocrystals with a size on the order of nanometers due, at least in part, to the alkyl substituents.

Phthalocyanine/Polymer Nanocomposite Ink for Optoelectronics

Various aspects are now described with reference to the drawings. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing these aspects.

As used herein, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Various aspects relate to the development of a polymer composite ink, based on Pc nanocrystal dyes in a polymer matrix, that can be utilized in the fabrication of optoelectronic devices (e.g., thin film transistors, photovoltaic devices, etc.) by a simple solution process. According to an aspect, Pc/polymer composites can be spun on patterned silicon/silicon dioxide substrates and/or indium tin oxide coated (ITO) glass substrates. For example, thin film transistors can be fabricated in this manner based on a Pc/P3HT composite and/or photovoltaic devices can be fabricated in this manner based on a Pc/P3HT/PCBM composite. The optoelectronic devices can, for example, be utilized as power generators for consumable electronic devices, such as mobile phones, mp3 players, notebook computers, and the like.

Referring initially to FIG. 1, illustrated is a schematic process flow diagram of a process 100 for fabricating Pc nanocrystals (e.g., MeCuPc nanocrystals) to be utilized within the Pc/polymer composites. At element 102, Pc is synthesized. For example, Pc can be synthesized by mixing 4-alkylphthalonitrile and metal (II) salt in quinoline and heating under a nitrogen atmosphere. The mixture can be heated, for example, at 180 degrees Celsius for three hours. This process can result in a blue-colored precipitate.

At element 104, the precipitate can be cleaned and/or filtered. For example, the precipitate can be cleaned with an ethanol solution and a sodium hydroxide solution in succession. The cleaning can continue until the resultant solution (e.g., a filtered solution) is clear. The precipitate can be a blue powder. At element 106, the precipitate can be dried, for example, for 2 hours, for example, in an oven at 100 degrees Celsius. For the avoidance of doubt, such example drying times and oven temperatures are given for purpose of illustration, not limitation, and thus other drying times and/or oven temperatures are possible, here and where described elsewhere in the various alternate embodiments described herein.

At element 108, Pc nanocrystals can be grown, for example, by vacuum sublimation and simple vapor deposition. The dried precipitate can be placed in a heating zone of a horizontal quartz tube furnace. For example, the dried precipitate can be heated at 400 degrees Celsius under $10^{-2}$ Torr for five hours. The precipitate can self-assemble into Pc nanocrystals. The Pc nanocrystals (e.g., a blue powder) can be collected in a cool zone (e.g., 150 degrees Celsius) of the horizontal quartz tube furnace.

According to an aspect, process 100 can allow small diameter Pc nanocrystals (e.g., on the order of nanometers) to be fabricated in a large scale. Normally, Pc molecules can self assemble into wires of a size on the order of micrometers. However, the Pc nanocrystals can self assemble into crystals of a nanometer size at least because of peripheral modifications of the core. For example, one such peripheral modification can be the alkyl substituents in the core of the Pc nanocrystals that can hinder the Pc core from forming a large crystal. For example, the alkyl substituents can lead to a stronger π-π interaction of the phthalocyanine core, which is advantageous for charge transport (e.g., charge transport from a light harvest).

The Pc nanocrystals can exhibit poor solubility in various organic solvents, like Pc molecules. This can, for example, help the Pc nanocrystals to maintain a high crystallinity when doping a polymer for device fabrication. Additionally, Pc nanocrystals are stable in ambient conditions.

Figure 2:
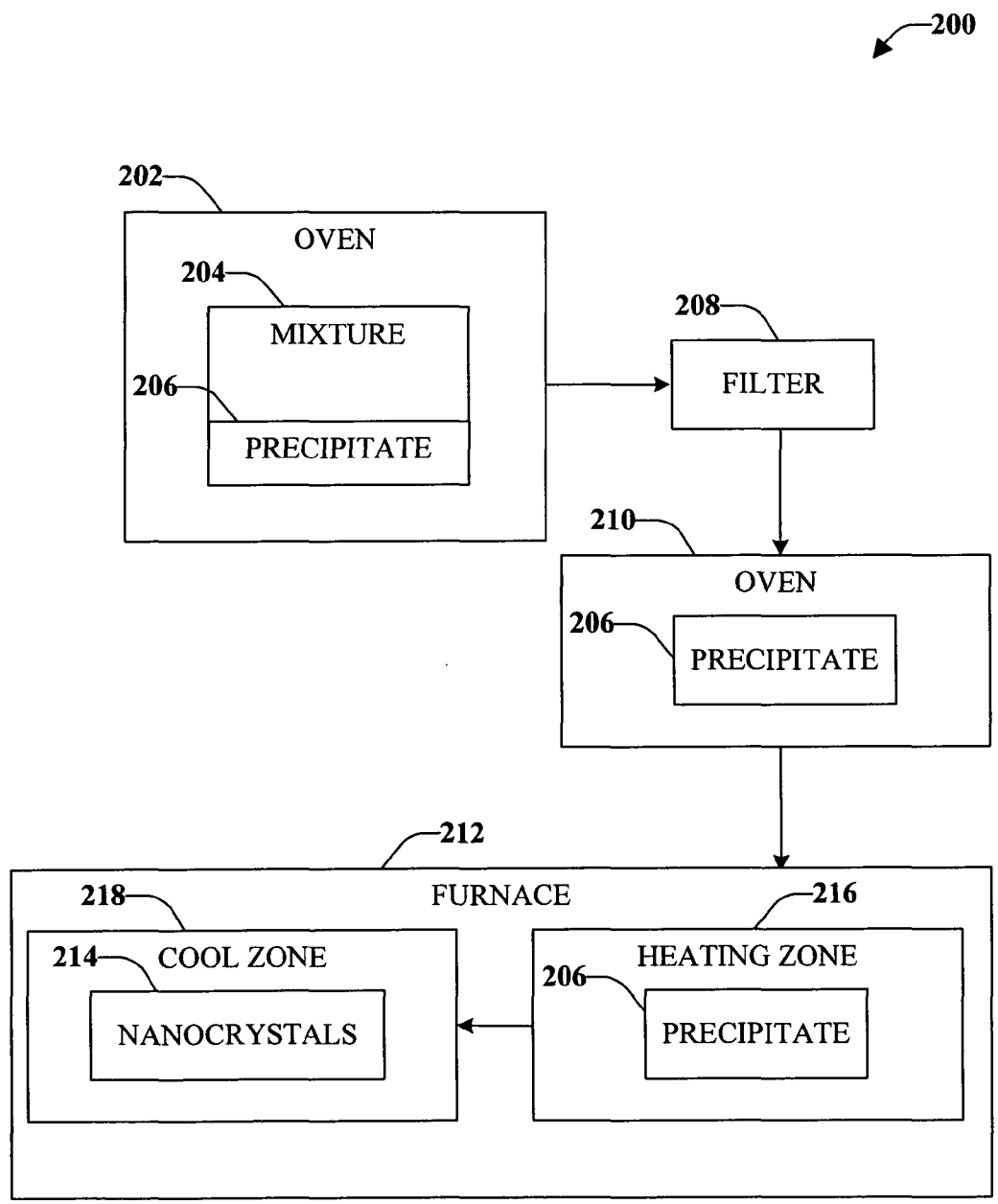
FIG. 2 is a schematic system block diagram of an exemplary system for fabricating the Pc nanocrystals.

Referring to FIG. 2, illustrated in a schematic system block diagram of an exemplary system 200 for fabricating the Pc nanocrystals to be utilized within the Pc/polymer composites. The system 200 can include an oven 202 that can heat a mixture 204 of 4-alkylphthalonitrile and metal (II) salt in quinoline under a nitrogen atmosphere. The mixture 204 can be heated, for example, at 180 degrees Celsius for three hours. This can result in a blue-colored precipitate 206.

The system 200 can include a filter 208 to clean and/or filter the precipitate 206. For example, the precipitate 206 can be cleaned with an ethanol solution and a sodium hydroxide solution in succession. The cleaning can continue until the resultant solution (e.g., a filtered solution) is clear. The precipitate 206 can be a blue powder. The system 200 can also include an oven 210 that can dry the precipitate 206, for example, at 100 degrees Celsius, for example, for 2 hours.

The system 200 can also include a horizontal quartz tube furnace 212 that can grow Pc nanocrystals 214 under vacuum sublimation and simple vapor deposition. The dried precipitate 206 can be placed in a heating zone 216 of the horizontal quartz tube furnace 212. For example, the heating zone 216 can heat the precipitate 206 at 400 degrees Celsius under $10^{-2}$ Torr for five hours. The precipitate 206 can self-assemble into Pc nanocrystals 214. The Pc nanocrystals 214 (e.g., a blue powder) can be collected in a cool zone 218 (e.g., 150 degrees Celsius) of the horizontal quartz tube furnace 212. This system 200 can be applied to large scale fabrication of the Pc nanocrystals 214.

Figure 3:
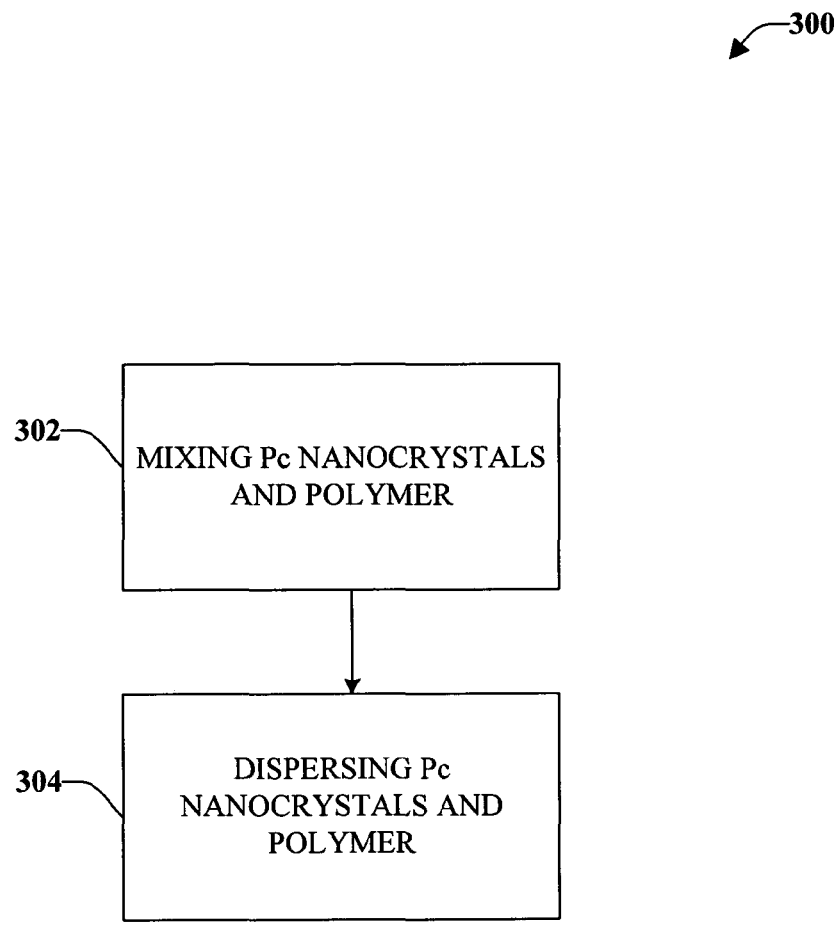
FIG. 3 is a schematic process flow diagram of a process for fabricating a Pc/polymer composite.

Referring to FIG. 3, illustrated is a schematic process flow diagram of a process 300 for fabricating Pc/polymer composites. At 302, the Pc nanocrystals can be mixed with at least one conjugated polymer. For example, the Pc nanocrystals and the at least one conjugated polymer can be mixed at different weight ratios. The Pc nanocrystals are inherently p-type semiconductors, and the at least one conjugated polymer should be chosen as a different p-type conjugated polymer. For example, this selection of a different p-type conjugated polymer can increase the film formation ability of the mixture and the charge transport properties of the mixture. At 304, the mixture of the Pc nanocrystals and the at least one conjugated polymer can be dispersed, for example, in chloroform by ultrasonic bath, and at 306, a composite film can be formed. For example, the Pc/polymer composites can be a film and/or an ink.

According to an embodiment, when utilized in connection with an optoelectronic device, the composite film and/or ink can exhibit good charge transport properties and a wide wavelength (e.g., ultraviolet—visible light, from 400 nm-800 nm) absorption (e.g., for an extended solar light harvest). These charge transport and absorption properties can be important for fabrication of optoelectronic devices (e.g., thin film transistors, photovoltaic cells, etc.) with high efficiencies. The efficiencies can be increased by altering the materials in the composite ink and/or film to alter and/or exploit various material properties (e.g., phase separation and/or phase crystallinity between the polymer material and the Pc nanocrystals). The film and/or ink is stable in ambient conditions and can be applied to large scale applications. For example, the composite film and/or ink can be utilized in connection with various hybrid structures for optoelectronic devices that include a p-n junction. According to an embodiment, the hybrid structure can be an organic/inorganic hybrid structure.

Figure 4:
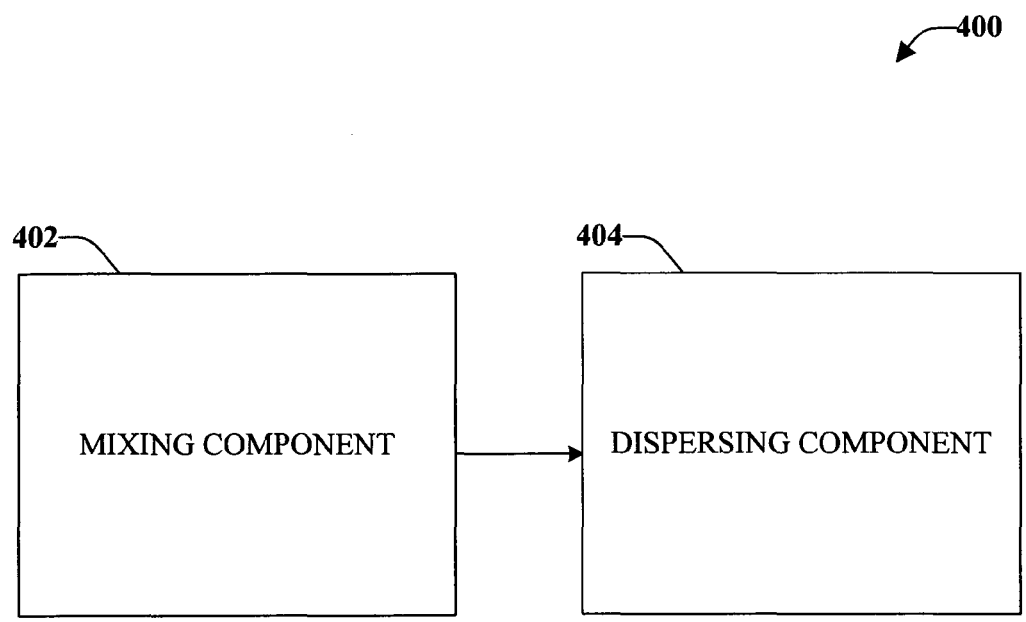
FIG. 4 is a schematic system block diagram of an exemplary system for fabricating the Pc/polymer composite.

Referring to FIG. 4, illustrated is a schematic system block diagram of an exemplary system 400 for fabricating the Pc/polymer composite. The system 400 can include a mixing component 402 that mixes the Pc nanocrystals with at least one conjugated polymer. The system 400 can also include a dispersing component 404 that disperses the mixture of the Pc nanocrystals and the at least one conjugated polymer. For example, the dispersing component 404 can be an ultrasonic bath that can disperse the mixture (e.g., in chloroform).

Figure 5:
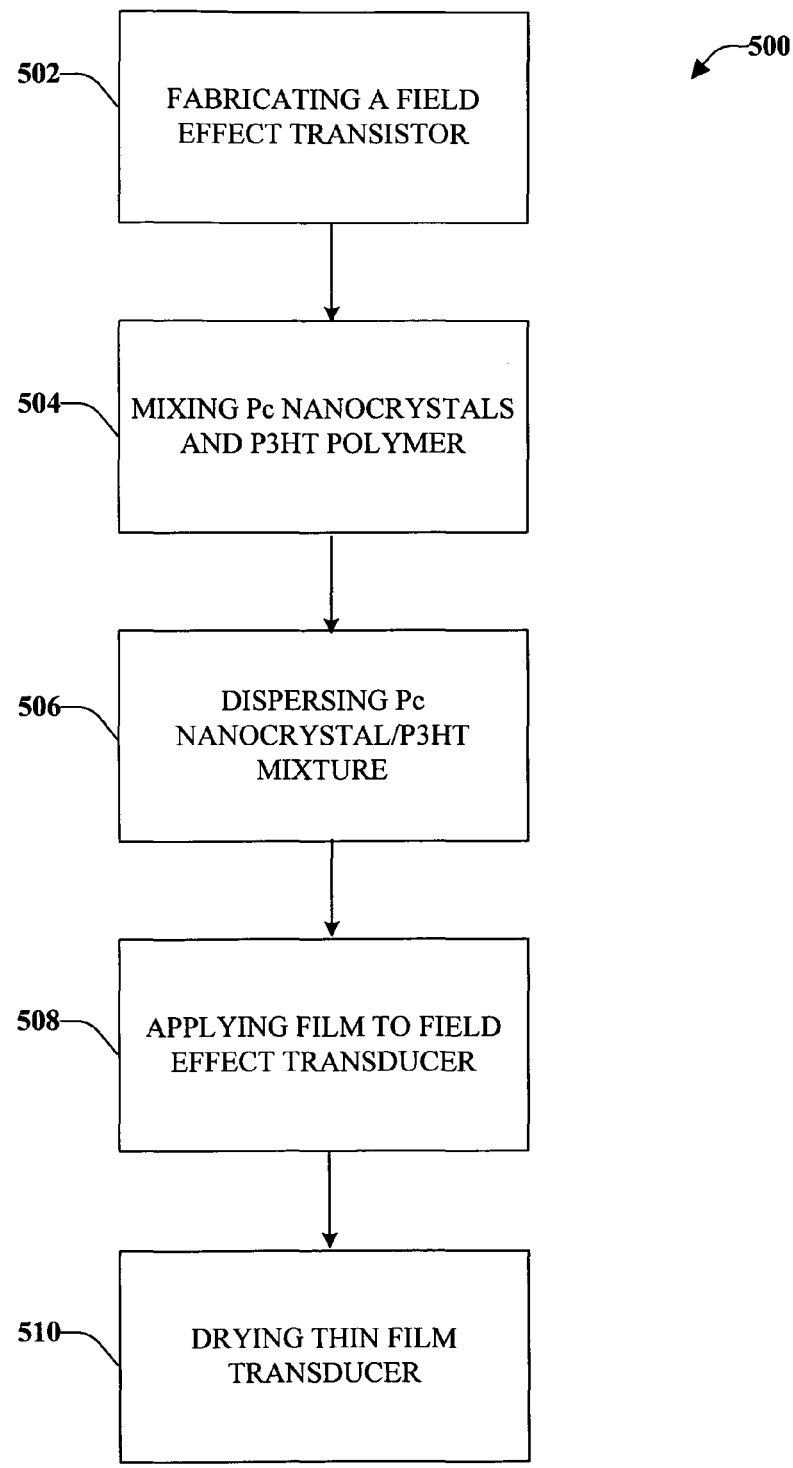
FIG. 5 is a schematic process flow diagram of a process for fabricating a thin-film transistor.
Figure 6:
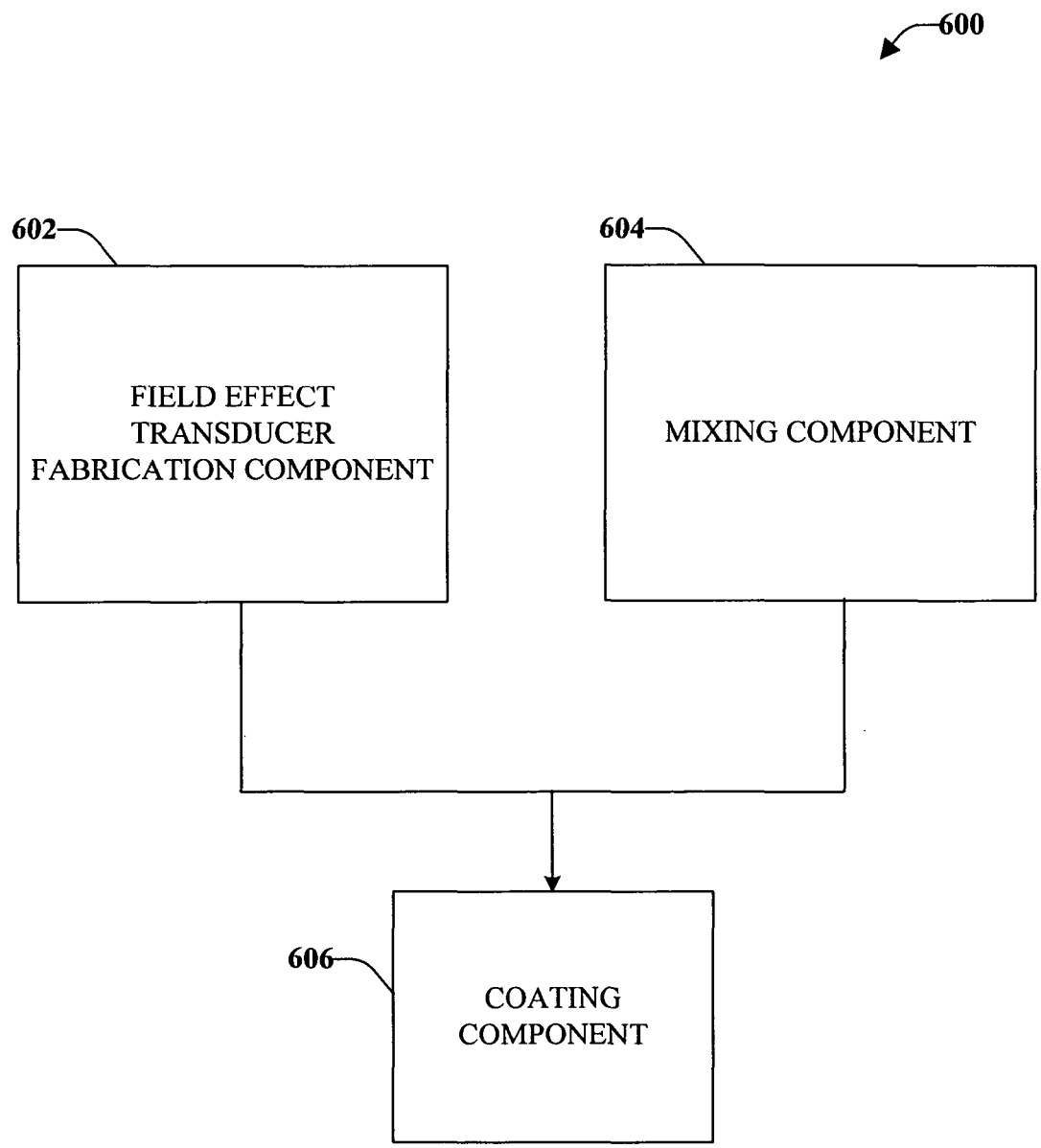
FIG. 6 is a schematic system block diagram of an exemplary system for fabricating the thin-film transistor.
Figure 7:
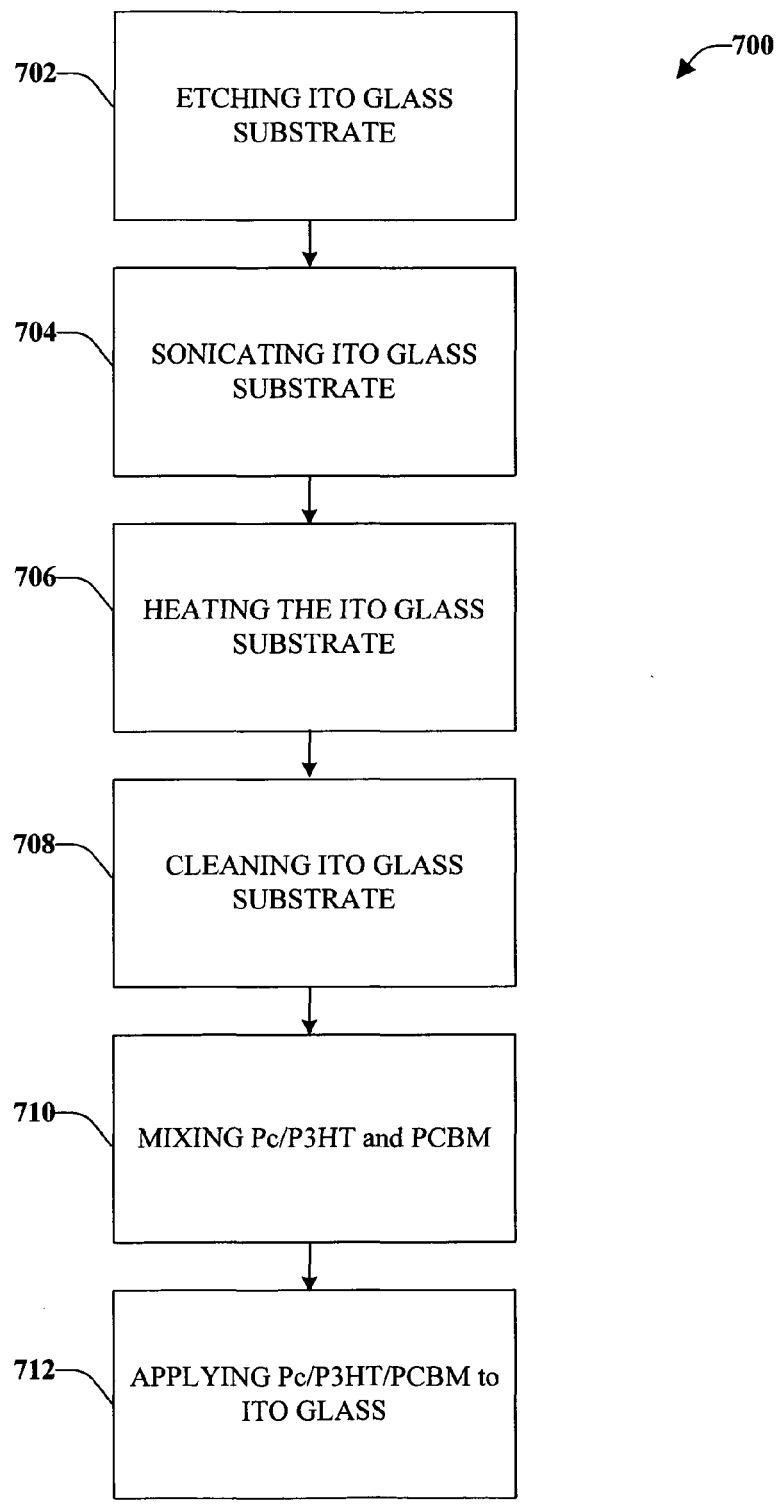
FIG. 7 is a schematic process flow diagram of a process for fabricating a photovoltaic device.
Figure 8:
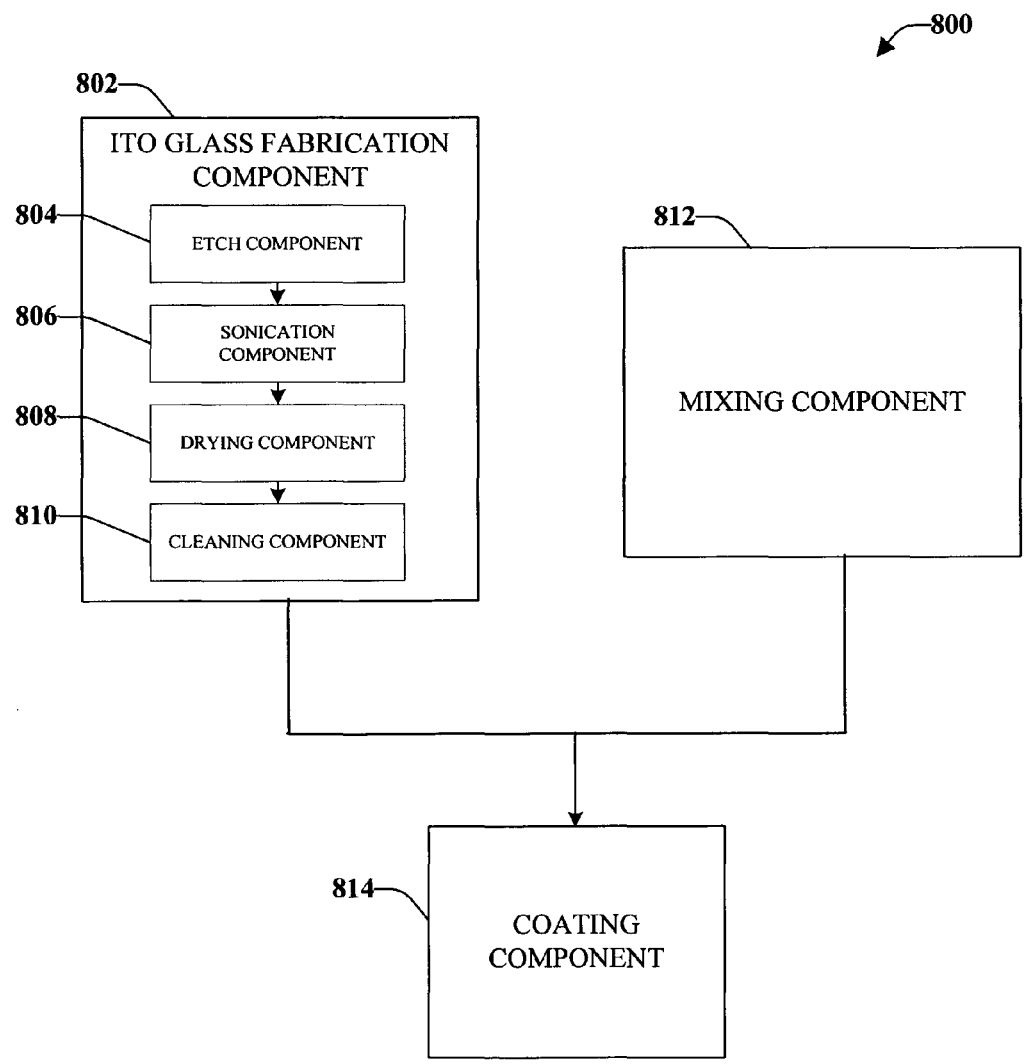
FIG. 8 is a schematic system block diagram of an exemplary system for fabricating the photovoltaic device.

According to an aspect, the Pc/polymer composite can be utilized in the fabrication of optoelectronic devices. For example, as shown in FIGS. 5 and 6, the Pc/polymer can be utilized to fabricate a thin-film transistor. As shown in FIGS. 7 and 8, the Pc/polymer can be utilized to fabricate a photovoltaic device.

The optoelectronic devices fabricated with the Pc/polymer composite can exhibit several favorable properties. While most organic conjugated polymers exhibit an ultraviolet-visible absorbance range between 300-600 nm, the Pc/polymer composite ink can exhibit a wide ultraviolet-visible absorbance range (e.g., from 400-800 nm. Additionally, while most organic conjugated polymers exhibit a hole mobility of $10^{-5}$-$10^{-3}$ cm$^2$/Vs, the Pc/polymer composite can exhibit a hole mobility on the order of $10^{-1}$ cm$^2$/Vs or more. Accordingly, the wide absorbance range and the greater hole motility can allow fabrication of devices with a higher power conversion efficiency (PCE) than traditional optoelectronic devices. For example, the Pc nanocrystal can better infiltrate into the polymer, thus increasing the light harvesting of the optoelectronic device. Additionally, the Pc nanocrystals and the Pc/polymer composite are both stable in ambient conditions.

According to an aspect, the optoelectronic device coated with the Pc/polymer composite can exhibit a hole mobility of up to 0.025 cm$^2$/Vs and a PCE of up to 5 percent. According to another aspect, the optoelectronic device coated with the Pc/polymer composite can exhibit a hole mobility of up to 0.1 cm$^2$/Vs and a PCE of up to 7 percent.

Referring to FIG. 5, illustrated is a schematic process flow diagram of a process 500 for fabricating a thin-film transistor. At element 502, a thin film transistor can be fabricated. According to an embodiment, a heavily doped silicon substrate can be utilized as a gate electrode, and a silicon dioxide dielectric layer (e.g., 100 nm) can be thermally grown on the silicon substrate. Source/drain contact patterns (e.g., Ti/Au source/drain contact patterns) can be formed through image reversal photolithography followed by a standard lift-off process. According to an embodiment, the thin film transistor can have a channel width (W) of between approximately 100 microns and approximately 30000 microns and a channel length (L) of between approximately two microns and approximately 100 microns.

At element 504, Pc nanocrystals can be mixed with poly (3-hexylthiophene)(P3HT) (Sigma-Aldrich, Inc.) in different weight ratios. At element 506, the mixture can be dispersed. For example, the mixture can be dispersed in chloroform by an ultrasonic device. At element 508, the composite solution can be applied to the thin film transistor. According to an aspect, the composite solution can be spin coated on the pattern silicon/silicon dioxide substrate. At element 510, the thin-film transistor can be dried. For example, the thin-film transistor can be dried in an oven at 80 degrees Celsius, for example for 15 minutes in a nitrogen atmosphere.

Referring to FIG. 6, illustrated is a schematic system block diagram of an exemplary system 600 for fabricating the thin-film transistor. The system 600 can include a component 602 that can fabricate a thin film transistor. For example, the component 602 can fabricate a thin film transistor utilizing a heavily doped silicon substrate as a gate electrode, upon which a silicon dioxide dielectric layer (e.g., 100 nm) can be thermally grown. The component 602 can also ensure that source/drain contact patterns (e.g., Ti/Au source/drain contact patterns) can be formed, for example, through image reversal photolithography followed by a standard lift-off process. According to an embodiment, the thin film transistor can have a channel width (W) of between approximately 100 microns and approximately 30000 microns and a channel length (L) of between approximately two microns and approximately 100 microns.

The system 600 can also include a component 604 that can mix the Pc nanocrystals with P3HT at different weight ratios and disperse the mixture. For example, the component 604 can include an ultrasonic device that can disperse the mixture, for example, in chloroform. The system 600 can also include a coating component 606 that can apply the Pc/P3HT mixture to the thin film transistor so that the Pc/P3HT mixture forms a thin film. According to an embodiment, the coating component 606 can include a device that can spin coat the Pc/P3HT mixture onto the thin film transistor. The system 600 can also include a drying component (e.g., an oven) that can dry the thin-film transistor (e.g., in a nitrogen atmosphere).

Referring to FIG. 7, illustrated is a schematic process flow diagram of a process 700 for fabricating a photovoltaic cell. At element 702, an ITO glass substrate can be etched. For example, the ITO glass can be a commercial ITO glass (e.g., approximately 150 nm, 3.8×3.8 cm$^2$) with a sheet resistance of approximately 20 Ω/sq. The ITO glass can be etched, for example, by a one-step process in which the ITO glass, protected by plating tape, can be dipped into an acid etch. For example, the acid etch mixture can include deionized (DI) water (e.g., 300 milliliters), hydrochloric acid (e.g., 225 milliliters), and nitric acid (e.g. 75 milliliters). According to an aspect, the etching process can include vigorous stirring as the ITO glass, protected by plating tape, is dipped into the acid etch for fifteen minutes at room temperature. After removal from the acid etch, the ITO glass can be rinsed (e.g., with DI water). After etching, the ITO glass can be patterned. According to an embodiment, the patterned ITO glass can have four identical arrangements.

At element 704, the ITO glass can be sonicated. For example, the ITO glass can be soaked in a water-based detergent while undergoing sonication (e.g., for 20 minutes at 60 degrees Celsius), rinsed with DI water, sonicated in DI water, and sonicated in ethanol, toluene and acetone (e.g., for 20 minutes at 60 degrees Celsius respectively, in three cycles), then rinsed with D1 water, and dried (e.g., with a nitrogen blowgun). At element 708, the ITO glass can heated (e.g., in an oven at 120 degrees Celsius for two hours), and at element 708, the ITO glass can be cleaned (e.g., in ultraviolet ozone for 30 minutes).

At element 710, a Pc/P3HT composite (e.g., fabricated as described above) can be mixed with phenyl-C61-butyric acid methyl ester (PCBM). For example, the Pc/P3HT solution and the PCBM can be dissolved in chloroform respectively and mixed together by ultrasonic bath (e.g., for approximately 5-10 minutes). At element 710, the Pc/P3HT/PCBM solution can be applied to the ITO substrate. For example, the Pc/P3HT/PCBM solution can be spin coated on the ITO substrate. According to an aspect, the thickness of the Pc/P3HT/PCBM can be controlled by spin rate, spin time, and/or concentration of solution. The thickness of the Pc/P3HT/PCBM can be measured by surface profilometers. The Pc/P3HT/PCBM thin film can be dried (e.g. in a vacuum at 80 degrees Celsius for two hours). According to an embodiment, the thin film can be patterned through wiping off unwanted portions by a solvent. The ITO glass with the thin film can be transferred to a vacuum chamber to deposit a cathode (e.g., a metal cathode). After fabrication, the photovoltaic cell can be transferred to a glove dry box (e.g., without exposure to air, water and oxygen less than 0.1 parts per million) for encapsulation. This can avoid oxidation by air and water.

Referring to FIG. 8, illustrated is a system block diagram of an exemplary system 800 for fabricating the photovoltaic cell. The system 800 can include an ITO glass substrate fabrication component 802. The ITO glass fabrication component 802 can include an etching component 804. The etching component 804 can include an acid etch mixture. For example, the acid etch mixture can include deionized (DI) water (e.g., 300 milliliters), hydrochloric acid (e.g., 225 milliliters), and nitric acid (e.g. 75 milliliters). The ITO glass fabrication component 802 can also include a sonication component 806. The ITO glass fabrication component 802 can also include a drying component 808 (e.g., an oven, heating the ITO glass for two hours at 120 degrees Celsius). The ITO glass fabrication component 802 can also include a cleaning component 810. For example, the cleaning component can include a component that can deliver ultraviolet ozone to the ITO glass.

The system 800 can also include a mixing component 812 that can mix the Pc/P3HT composite (e.g., fabricated as described above) with PCBM. For example, the mixing component can include an ultrasonic bath. The system 800 can also include a coating component 814 that can coat the ITO glass with the Pc/P3HT/PCBM. For example, the coating component 814 can include a component that can spin coat the ITO substrate with the Pc/P3HT/PCBM. The system can include a vacuum chamber (not shown) and a drying component (not shown).

What has been described above includes examples of systems and methods that provide advantages of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The embodiments as disclosed and described in the application are intended to be illustrative and explanatory, and not limiting. Modifications and variations of the disclosed embodiments, for example, of the processes and apparatuses employed (or to be employed) as well as of the compositions and treatments used (or to be used), are possible; all such modifications and variations are intended to be within the scope of this application.

What is claimed is:

1. An apparatus, comprising:
   a thin film of at least one conjugated polymer doped with phthalocyanine (Pc) nanocrystals,
   wherein the Pc nanocrystals are of a size on the order of nanometers,
   wherein the at least one conjugated polymer is a different p-type semiconductor than the Pc nanocrystals, and
   wherein a Pc nanocrystal of the Pc nanocrystals comprises a core portion that comprises alkyl substituents.

2. The apparatus of claim 1, wherein the Pc nanocrystal comprises the core portion and another Pc nanocrystal portion that is associated with the core portion.

3. The apparatus of claim 1 or 2, wherein the apparatus is a photovoltaic cell and the at least one conjugated polymer is poly(3-hexylthiophene)(P3HT)/phenyl-C61-butyric acid methyl ester (PCBM).

4. The apparatus of claim 1 or 2, wherein the apparatus is a thin film transistor and the at least one conjugated polymer is poly(3-hexylthiophene)(P3HT).

5. The apparatus of any one of claim 1, wherein the apparatus has a power conversion efficiency (PCE) of at least 5 percent.

6. The apparatus of claim 5, wherein the apparatus has a PCE of at least 7 percent.

7. The apparatus of any one of claim 1, wherein the apparatus has a mobility of at least 0.025 $cm^2/Vs$.

8. The apparatus of claim 7, wherein the apparatus has a mobility of at least 0.01 $cm^2/Vs$.

9. An optoelectronic device, comprising:
   a thin film composed of at least one conjugated polymer and phthalocyanine (Pc) nanocrystals,
   wherein the Pc nanocrystals are of a size on the order of nanometers, and
   wherein a Pc nanocrystal of the Pc nanocrystals comprises a core portion that comprises alkyl substituents.

10. The device of claim 9, wherein the at least one conjugated polymer is a different p-type semiconductor than the Pc nanocrystals.

11. The device of claim 9, wherein the optoelectronic device comprises at least one of a thin film transistor or a photovoltaic cell.

12. A device, comprising:
   a film formed from a combination of at least one conjugated polymer doped and phthalocyanine (Pc) nanocrystals,
   wherein the Pc nanocrystals are of a size on the order of nanometers,
   wherein the at least one conjugated polymer is a different p-type semiconductor than the Pc nanocrystals, and
   wherein a Pc nanocrystal of the Pc nanocrystals comprises a core portion that comprises an alkyl substituent.

13. The device of claim 12, wherein the at least one conjugated polymer is poly(3-hexylthiophene)(P3HT) or P3HT/phenyl-C61-butyric acid methyl ester (PCBM).

14. The device of claim 12, wherein the device comprises at least one of a thin film transistor or a photovoltaic cell.

* * * * *